United States Patent
Ko

(10) Patent No.: US 6,560,968 B2
(45) Date of Patent: May 13, 2003

(54) THERMOELECTRIC COOLER

(75) Inventor: Cheol Soo Ko, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/985,128

(22) Filed: Nov. 1, 2001

(65) Prior Publication Data

US 2002/0083716 A1 Jul. 4, 2002

(30) Foreign Application Priority Data

Dec. 29, 2000 (KR) ........................................ 2000-85757

(51) Int. Cl.[7] ................................................ F25B 21/02
(52) U.S. Cl. .............................. 62/3.2; 62/3.6; 62/3.62; 62/3.3
(58) Field of Search ........................... 62/3.2, 3.6, 3.62, 62/3.3

(56) References Cited

U.S. PATENT DOCUMENTS

| | | | | |
|---|---|---|---|---|
| 4,942,863 A | * | 7/1990 | Chou et al. ............... | 126/110 E |
| 5,097,828 A | * | 3/1992 | Deutsch ...................... | 128/399 |
| 5,501,076 A | * | 3/1996 | Sharp, III et al. ............. | 62/3.6 |
| 5,522,216 A | * | 6/1996 | Park et al. .................... | 62/3.6 |
| 5,544,488 A | * | 8/1996 | Reid ............................. | 62/3.7 |
| 5,623,828 A | * | 4/1997 | Harrington ................... | 62/3.2 |
| 5,896,917 A | * | 4/1999 | Lemont et al. ............ | 165/80.3 |
| 6,120,247 A | * | 9/2000 | Wheeler ...................... | 416/1 |
| 6,173,575 B1 | * | 1/2001 | Hall et al. ..................... | 62/3.2 |
| 6,301,901 B1 | * | 10/2001 | Coffee et al. ................. | 62/3.7 |
| 2002/0017102 A1 | * | 2/2002 | Bell ............................... | 32/3.7 |

* cited by examiner

Primary Examiner—William C. Doerrler
Assistant Examiner—Mark Shulman
(74) Attorney, Agent, or Firm—Birch, Stewart, Kolasch & Birch, LLP

(57) ABSTRACT

The present invention relates to a thermoelectric cooler, and more particularly, to a thermoelectric cooler, in which a thermoelectric module is applied to a blow system of a fan blade set and a motor, for converting a current blow system into a blow system having a cooling function with a low noise.

To do this, the present invention provides a thermoelectric cooler including a thermoelectric module having thermoelectric elements each for absorbing or dissipating a heat at a junction of two different metal depending on a direction of a current flowing through the junction, a fan blade set for blowing air cooled at a heat absorption side of the thermoelectric module to a desired place, and a motor for giving a rotating force to the fan blade set.

19 Claims, 8 Drawing Sheets

(a)

heat dissipation side
heat absorption side (b)

heat dissipation side
heat absorption side (c)

heat dissipation side
heat absorption side

THERMOELECTRIC COOLER

BACKGROUND OF THE INVENTION

1. Field of the Invention

The present invention relates to a thermoelectric cooler, and more particularly, to a thermoelectric cooler, in which a thermoelectric module is applied to a current blow system of a fan, for converting a simple blow system into a blow system having a low noise cooling function.

2. Background of the Related Art

In general, the blow system is provided with a motor for generating a driving force, and a fan for being rotated by the motor to blow air forcibly, of which typical example is an electrical fan.

A related art electrical fan will be explained with reference to FIG. 1. FIG. 1 illustrates a related art electrical stand type fan, provided with a motor 21 in an upper part of a body, and fan blade set 22 shaft coupled to the motor 21 in front thereof. When the fan blade set 22 are rotated, the related art electrical fan cools down a temperature of an object as the air accelerates heat exchange between a surface of the object and the air by convection when the air forcibly flows from rear of the fan blade set 22 to front of the electrical fan 2.

However, the electrical fan 2 can not cool down a temperature of room air. That is, in general, because the electrical fan merely circulates the room air forcibly, a user feels no coolness if the room temperature is similar to a body temperature. Contrary to this, as the fan blade set 22 are fixed to a motor 21 shaft, the electrical fan 2 becomes to blow warm air when the electrical fan 2 is used for a long time, since a heat of the motor 21 heated from prolonged use is rejected to a front part of the electrical fan 2 through the fan blade set 22.

In the meantime, general air conditioners used in home for dropping a room temperature are mostly of a separated, vapor compression type in which the air conditioner is separated into an indoor unit and an outdoor unit. In a case of such a air conditioner in which room air is cooled down by using a phase change of refrigerant, though a cooling capability is excellent, there are following problems.

Re-positioning of once installed indoor unit and outdoor unit of the air conditioner is difficult, and there are spatial limitations in selection of an installation position of the air conditioner.

The air conditioner produces a loud noise, and has a poor durability to cause refrigerant leakage, or disorder in a driving part, a great power consumption to give a heavy burden to consumers, and expensive.

SUMMARY OF THE INVENTION

Accordingly, the present invention is directed to a thermoelectric cooler that substantially obviates one or more of the problems due to limitations and disadvantages of the related art.

An object of the present invention is to provide a thermoelectric cooler, in which a thermoelectric module of the Peltier effect is applied to current electric fan to provide a cooling function to a simple electric fan, for providing a cooler which has a low cost compared to an air conditioner, low noise and low power consumption caused by a driving part, and a long lifetime, and permits easy re-positioning.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the thermoelectric cooler includes a thermoelectric module having thermoelectric elements each for absorbing or dissipating a heat at a junction of two different metal depending on a direction of a current flowing through the junction, a fan blade set for blowing air cooled at a heat absorption side of the thermoelectric module to a desired place, and a motor for giving a rotating force to the fan blade set.

An area of the planar thermoelectric module may vary with a required cooling capacity, and preferably at least larger than an area of the fan blade set.

The thermoelectric module is planar, preferably, in a circular or rectangular form.

The circular, or rectangular thermoelectric module may have a variety of sections, such as a straight line, bent form, or arc form.

The thermoelectric cooler may further has fins fitted to surfaces of the heat absorption side or a heat dissipation side of the thermoelectric module for increasing a heat transfer area.

The heat dissipation side of the thermoelectric module has a heat pipe or thermosiphon fitted thereto for rejection of heat to an outside of the room.

According to the present invention, when the thermoelectric module is employed in a current electric fan, the current electric fan can also serve as a cooler.

According to the present invention, when the heat dissipated at the heat dissipation side of the thermoelectric module is rejected to an outside of the room by using the heat pipe or the thermosiphon, a cooling efficiency is enhanced.

Because the heat pipe or the thermosiphon is employed for enhancing a cooling efficiency of the thermoelectric cooler of the present invention, a noise caused by a driving part and an increased power consumption are prevented.

As the thermoelectric cooler of the present invention is fabricated by applying a thermoelectric module to an electric fan that is not expensive, a fabrication cost is saved, fabrication and installation are easy, and purchasing cost is low.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings FIGS. 2–9. The thermoelectric cooler of the present invention includes thermoelectric elements connected in parallel, each of which causes a temperature difference between two ends thereof from an electromotive force to cause the Peltier effect.

Figure 1:
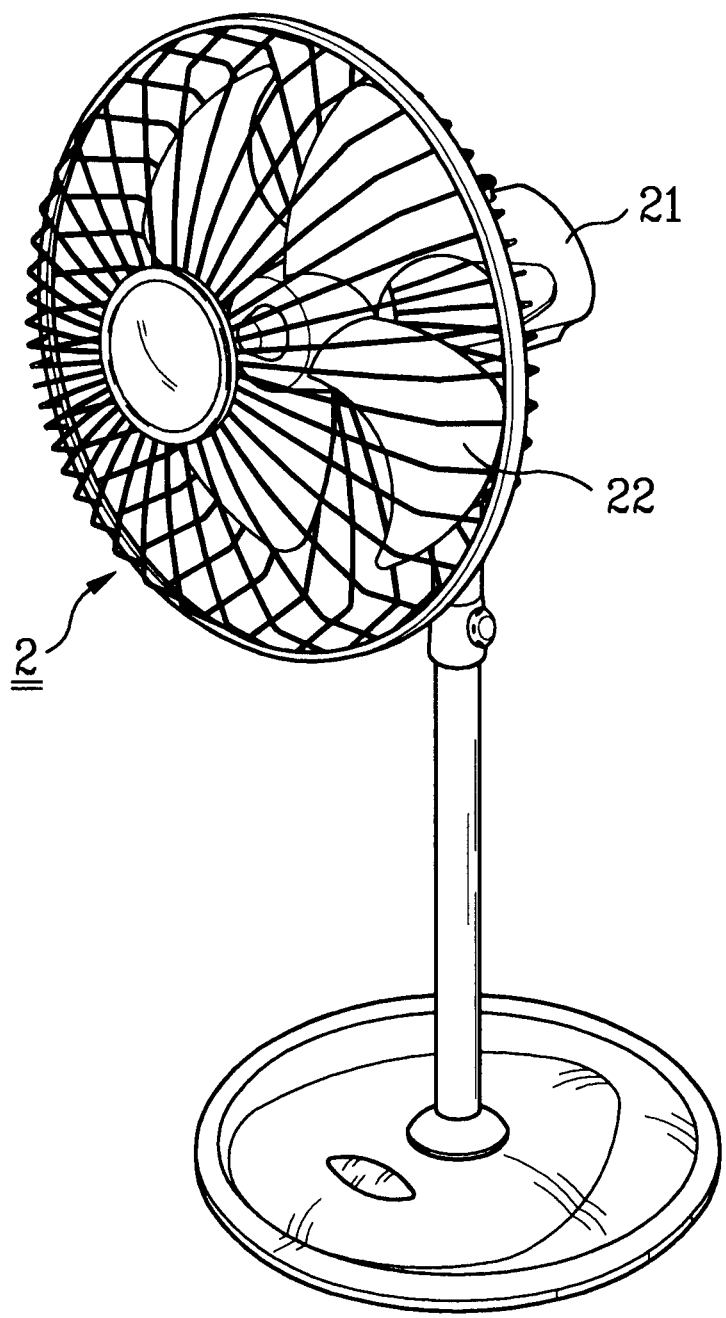
FIG. 1 illustrates a perspective view of an electrical fan, one of related art blow apparatuses.
Figure 2:
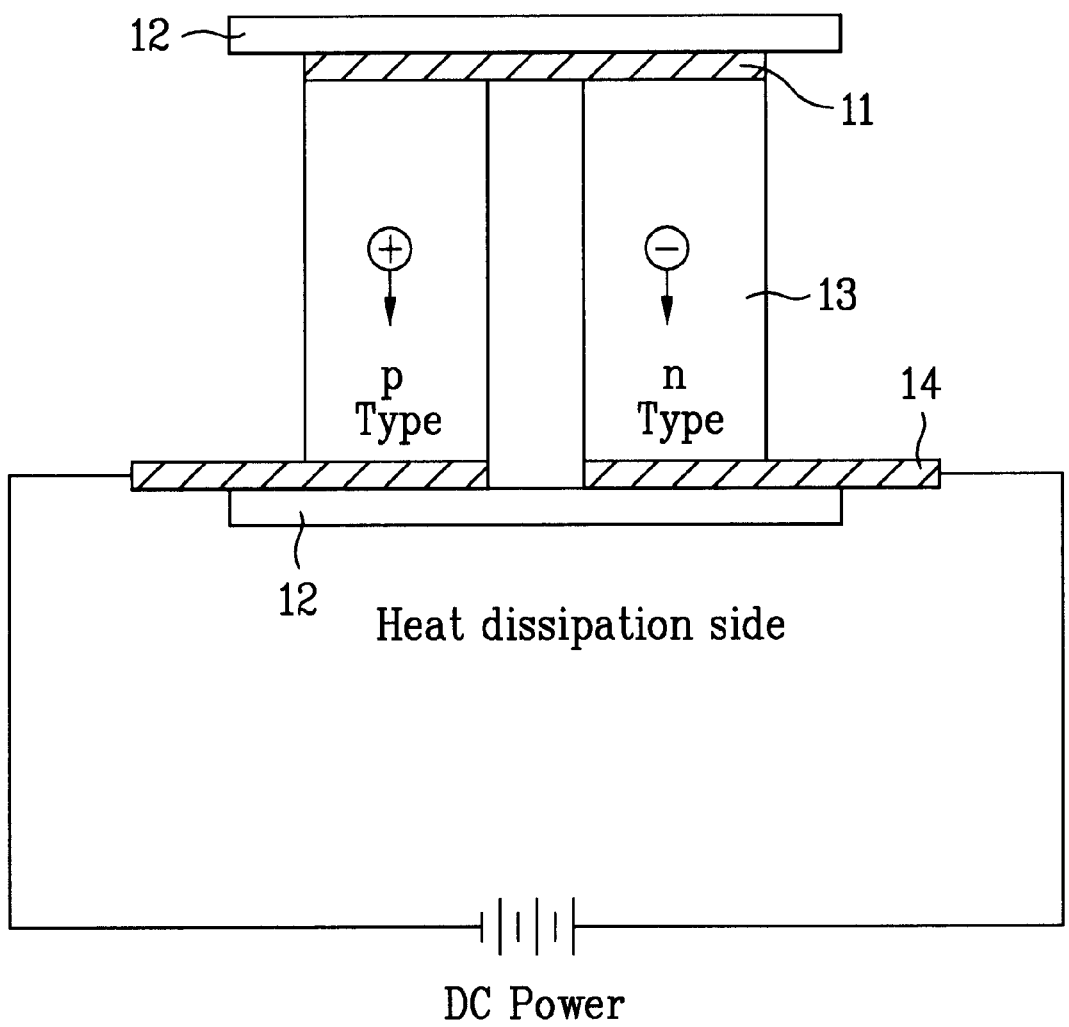
FIG. 2 illustrates a section a thermoelectric device in a thermoelectric module of a thermoelectric cooler of the present invention.

A system and work of a thermoelectric element employed in the thermoelectric cooler 100 of the present invention will be explained with reference to FIG. 2. FIG. 2 illustrates a section a thermoelectric device in a thermoelectric module of a thermoelectric cooler of the present invention, wherein the thermoelectric device includes thermoelectric elements 13 of semiconductor doped with N type impurity ions or P type impurity ions connected in parallel, electrodes 11 and 14 of copper or the like respectively connected to an upper side and a lower side of the thermoelectric elements 13, and a ceramic substrate 12 or the like enclosing the electrodes 11 and 14.

Upon application of a current (DC) to a junction part, the thermoelectric device is involved in the Peltier effect in which the upper part is cooled and the lower part is heated as electrons in the case of the N type semiconductor, or holes in the case of the P type semiconductor, take heat from the upper part and discharges the heat to the lower part. That is, in the Peltier effect, one of electric phenomenon, when a current flows through a junction part of two different metals, a heat is either dissipated or absorbed at the junction part. Therefore, upon application of the current to the thermoelectric device, one side of the thermoelectric device becomes a heat absorption side with a low temperature, and the other side of the thermoelectric device becomes a heat dissipation side with a high temperature, and, if a direction of the current is reversed, the heat absorption side and the heat dissipation side are reversed.

A basic system of the thermoelectric cooler of the present invention having the thermoelectric module 1 of the thermoelectric elements, which cause the Peltier effect, employed therein will be explained.

The thermoelectric cooler 100 of the present invention includes a thermoelectric module 1 having thermoelectric elements each for absorbing or dissipating a heat at a junction part depending on a direction of a current flowing through the junction part of two different metals, fan blade set 22 for directing air cooled at a heat absorption side of the thermoelectric module 1 to a desired place, and a motor 21 for providing a rotation force to the fan blade set 22. Of the junction part of the thermoelectric module 1, a side close to the fan blade set 22 forms the heat absorption side, and a side far from the fan blade set 22 forms the heat dissipation side.

The thermoelectric module 1 is formed flat, and more specifically, in a disk or rectangular form. Moreover, in order to form a smooth air flow toward the motor shaft coupled to the fan blade set 22, the thermoelectric module 1 may have a variety of forms, such as an arc form which is designed to have the smaller radius of curvature as it goes nearer to a front side of the electrical fan, or a bent form which has a bent at a middle part. The thermoelectric module 1 may have an area varied with a required cooling capacity, but preferably at least larger than an area of the fan blade set 22.

Figure 3:
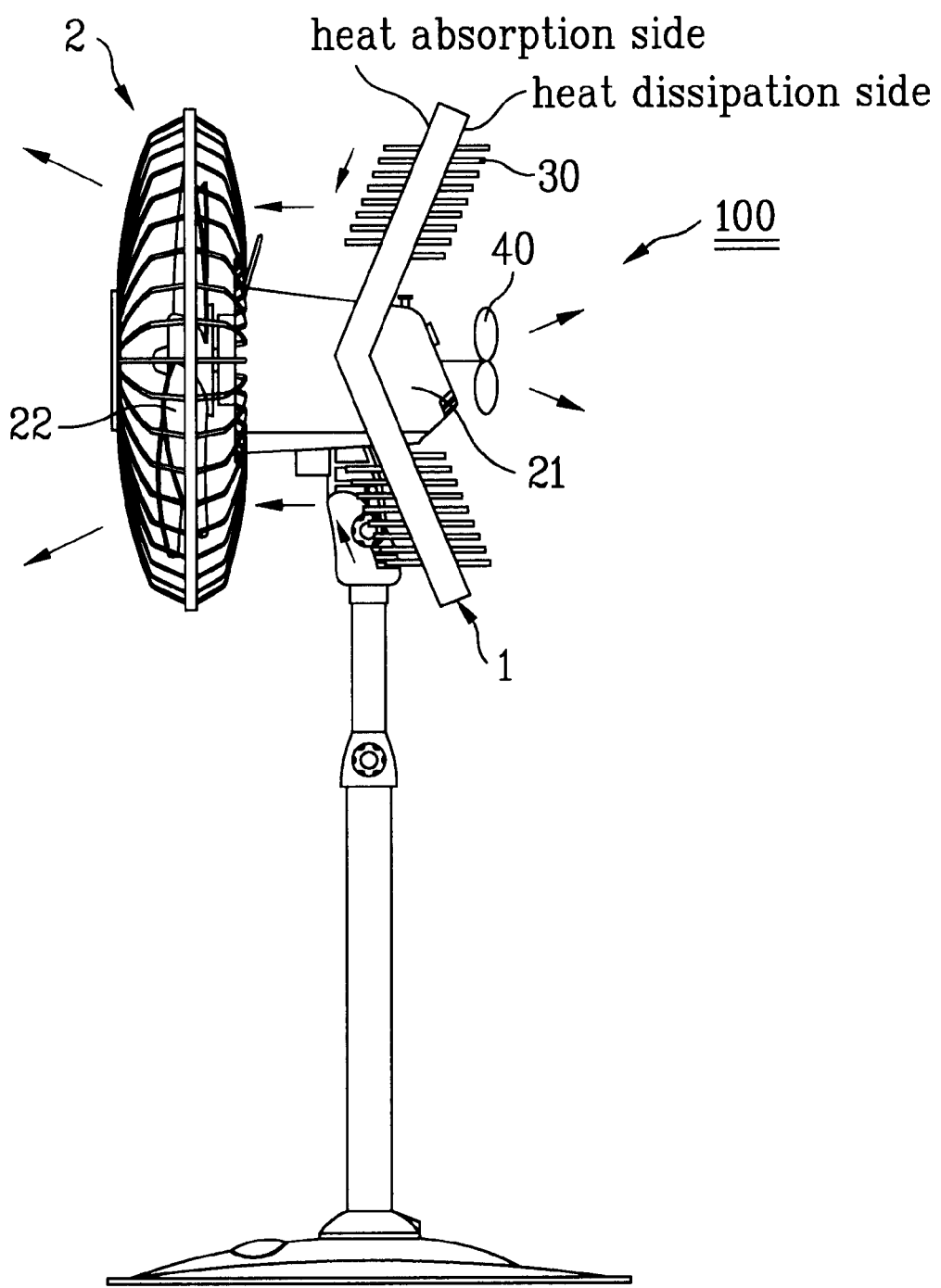
FIG. 3 illustrates a side view of a thermoelectric cooler in accordance with a first preferred embodiment of the present invention.

A thermoelectric cooler in accordance with a first preferred embodiment of the present invention will be explained in more detail. FIG. 3 illustrates a side view of a thermoelectric cooler in accordance with a first preferred embodiment of the present invention, and FIGS. 6A–6C illustrates perspective views of exemplary thermoelectric modules employed in the thermoelectric cooler of the present invention.

Referring to FIG. 3, the thermoelectric module 1 in accordance with a first preferred embodiment of the present invention is fitted to an outer circumference of the motor 21 in rear of the fan blade set 22 of the electric fan 2, and has a surface facing the fan blade set 22 serving as a heat absorption side, and a surface opposite to the fan blade set 22 serving as a heat dissipation side, when a power is applied to the thermoelectric module 1.

The air drawn from rear of the fan blade set 22 as the fan blade set 22 rotates heat exchanges with the heat absorption side of the thermoelectric module 1, is cooled down, and flows in a front direction of the electric fan 2. That is, the air drawn from rear of the fan blade set 22 of the electric fan is blown forcibly in a front direction of the electric fan in a cooled down state, to give a cool feeling to a user in front of the electric fan.

In the meantime, a variety of forms of heat dissipation means may be provided to the heat absorption side and the heat dissipation side of the first embodiment thermoelectric module 1 for improving a heat exchange efficiency. As one of specific examples, surfaces of the heat absorption side and the heat dissipation side may be designed to have a form that enhances heat exchange, or heat dissipation fins 30 may be fitted to the surfaces of the heat absorption side and the heat dissipation side. In addition to this, a small fan 40 coupled to the motor 21 of the electric fan 2 may be fitted to the heat dissipation side of the thermoelectric module 1, when the heat on the heat dissipation side can be rejected to a rear direction of the electric fan, quickly.

In the meantime, since the heat dissipated at the heat dissipation side is not rejected to outside of an enclosed space even if the heat dissipation fins 30 or the small fan 40 is fitted to the heat dissipation side, to elevate a room temperature in overall, another heat rejection means is provided for rejecting the heat on the heat dissipation side to outside of the enclosed space.

In the meantime, referring to FIGS. 7A–7C, the thermoelectric module 1 employed in the thermoelectric cooler 100 may have a through hole of a circular or other forms at a center thereof in conformity with a part, such as the motor 21, the thermoelectric module 1 is to be fitted, may be planar or cylindrical in an overall outer appearance, and, in addition to this, may be an arc form which has the smaller radius of curvature as it goes the nearer to a front side of the electrical fan, or a bent form which has a bent at a middle part, for smooth wind blow toward the motor shaft coupled to the fan blade set 22. A size of the thermoelectric module 1 may vary with a cooling requirement.

Figure 4:
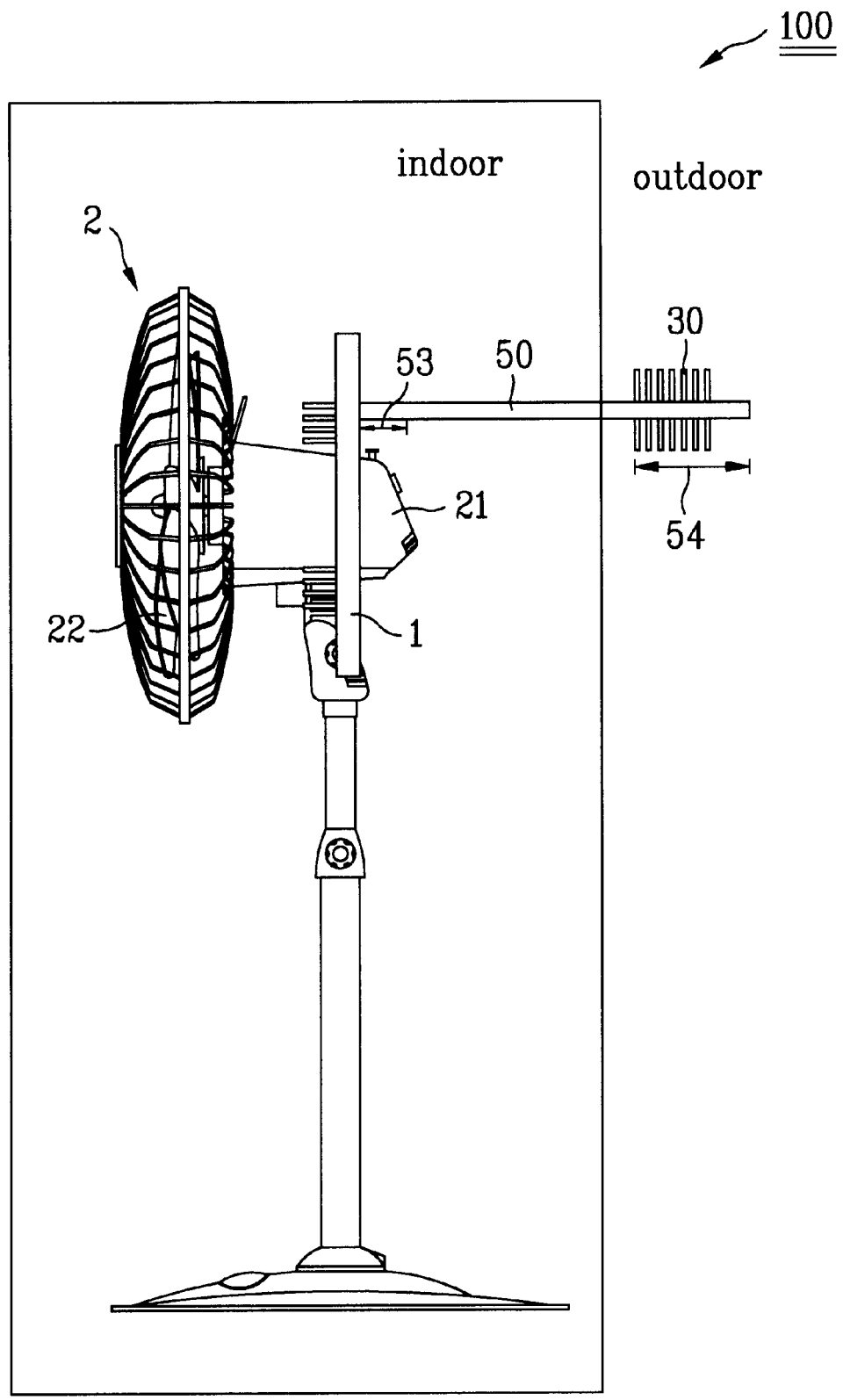
FIG. 4 illustrates a side view of a thermoelectric cooler in accordance with a second preferred embodiment of the present invention.

A second embodiment of the present invention will be explained with reference to FIG. 4. FIG. 4 illustrates a side view of a thermoelectric cooler in accordance with a second preferred embodiment of the present invention.

Figure 5:
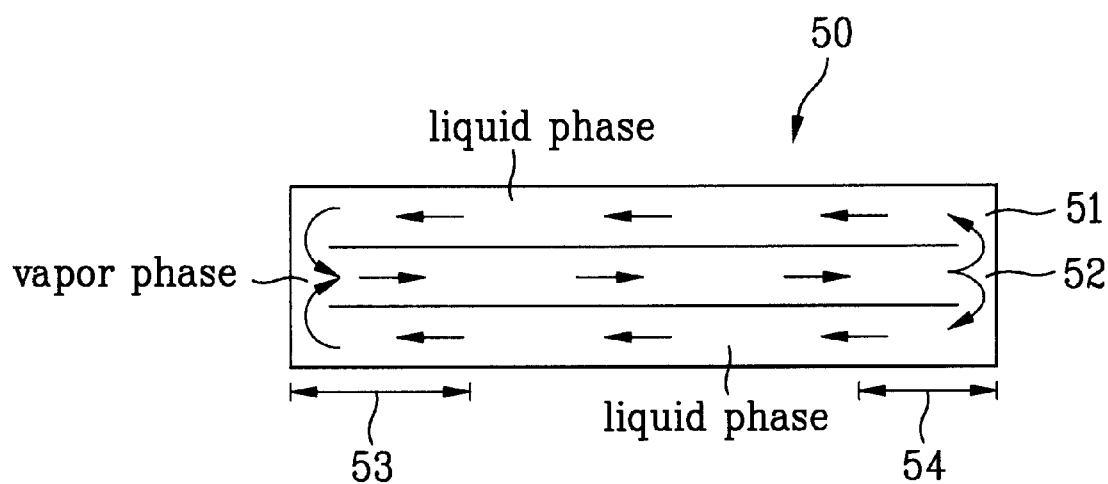
FIG. 5 illustrates a longitudinal section of the heat pipe in FIG. 4.
Figure 6:
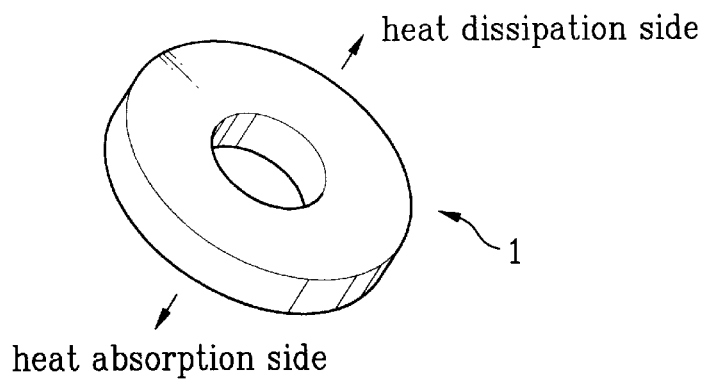
FIGS. 6A–6C illustrates perspective views of exemplary thermoelectric modules employed in the thermoelectric cooler of the present invention.
Figure 6:
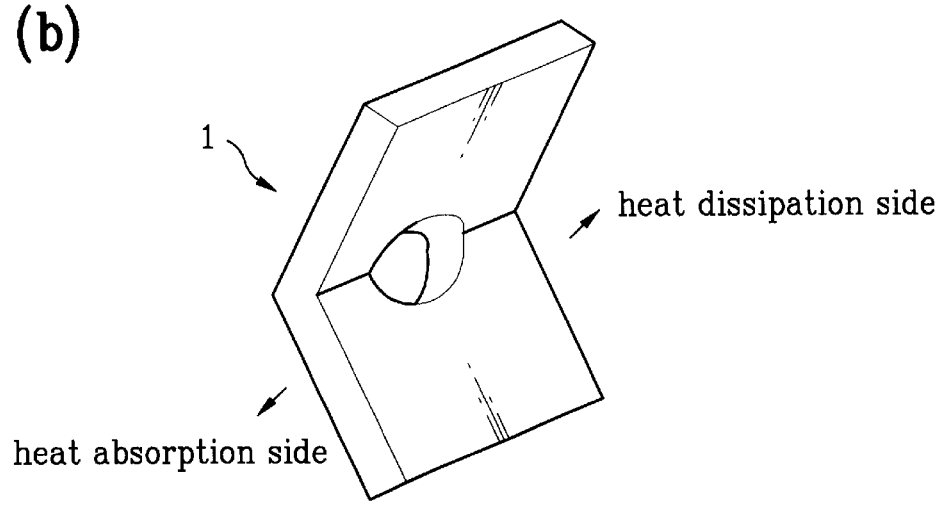
Figure 6:
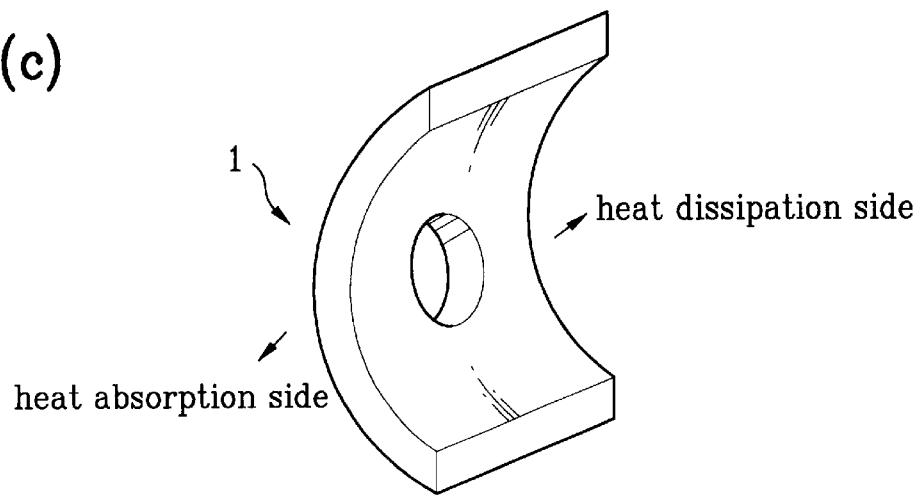

Referring to FIG. 4, there is a heat pipe 50 fitted to a heat dissipation side of a thermoelectric module 1 fitted to an outer circumference of the motor 1. As shown in FIG. 5, the heat pipe 50 includes a duplex tube of an inner tube 51 and an outer tube 52 formed of an insulating material, and both ends formed of an excellent heat conductive material. That is, as an example, the ends of the duplex tube may be formed of a good heat conductive material, such as copper, and most preferably, of a super-conductive material. An inside of the duplex tube is in a vacuum after a working fluid with an excellent heat absorptivity is injected therein. The working fluid is selected from helium, hydrogen, neon, and a mixture of them.

The working fluid flows toward the heat dissipation side of the thermoelectric module 1 in the outer tube 52 in a liquid state by capillary tube phenomenon, and takes a heat from the heat absorption side, converted into a gas state, expanded to flow to the an outside of room along the inner tube 51. Thus, a part close to the heat dissipation side of the thermoelectric module 1 within a part disposed in the room of the heat pipe 50 forms an evaporation part 53, and a part exposed to outside of the room forms a condensing part 54. The duplex tube is in communication at ends of the condensing part 54 and the evaporation part 53.

Upon application of a power to the thermoelectric module 1 having such a heat pipe 50 fitted thereto, the heat is dissipated at the heat dissipation side, and absorbed by the working fluid flowing along the outer tube 52 of the heat pipe 50 of a high heat conductivity. Accordingly, the working fluid absorbed a large amount of heat is vaporized by latent heat vaporization, flows toward the condensing part 54 at a very fast speed along the inner tube 51, transfers the heat to external air at the condensing part 62 exposed to outside of room, and is condensed. The condensed working fluid flows along the outer tube 52 to the evaporation part 53 side again by capillary forces, thereby making a continuous circulation within the heat pipe 50. On the other hand, the air cooled at the heat absorption side of the thermoelectric module 1 is blown to in a front direction of the electric fan, to drop a room temperature.

Eventually, since the heat pipe 50 with a very high heat conductivity is fitted to the heat dissipation side of the thermoelectric module 1, the second embodiment thermoelectric cooler 100 of the present invention can enhance a heat transfer efficiency even if a temperature difference between the heat absorption side and the heat dissipation side is very small because a large amount of heat can be transferred to the condensing part side through the heat pipe 50, and dissipated therefrom to the air.

Different from the general air conditioner, the second embodiment thermoelectric cooler 100 of the present invention has no noise caused by driving parts, such as compressors and the like, a long lifetime, and a significantly small power consumption, because the heat pipe 50 is fitted to the heat dissipation side of the thermoelectric module 1 to facilitate circulation of the working fluid and cooling only by heat transfer without the driving parts for forced circulation of the working fluid. In addition to this, it is apparent that the condensing part 54 of the heat pipe 50 may be designed to have a form of an increased surface area for effective heat dissipation, for an example, fins 30.

In the meantime, referring to FIGS. 6A–6C, the thermoelectric module 1 of the second embodiment thermoelectric cooler 100 of the present invention may have a through hole of circular or other forms at a center thereof in conformity with a part, such as the motor 21, the thermoelectric module 1 is to be fitted, may be planar or cylindrical in an overall outer appearance, and, in addition to this, may be an arc form which has the smaller radius of curvature as it goes the nearer to a front side of the electrical fan, or a bent form which has a bent at a middle part, for smooth wind blow toward the motor shaft coupled to the fan blade set 22.

A thermoelectric cooler in accordance with a third preferred embodiment of the present invention will be explained, with reference to FIG. 7.

Figure 7:
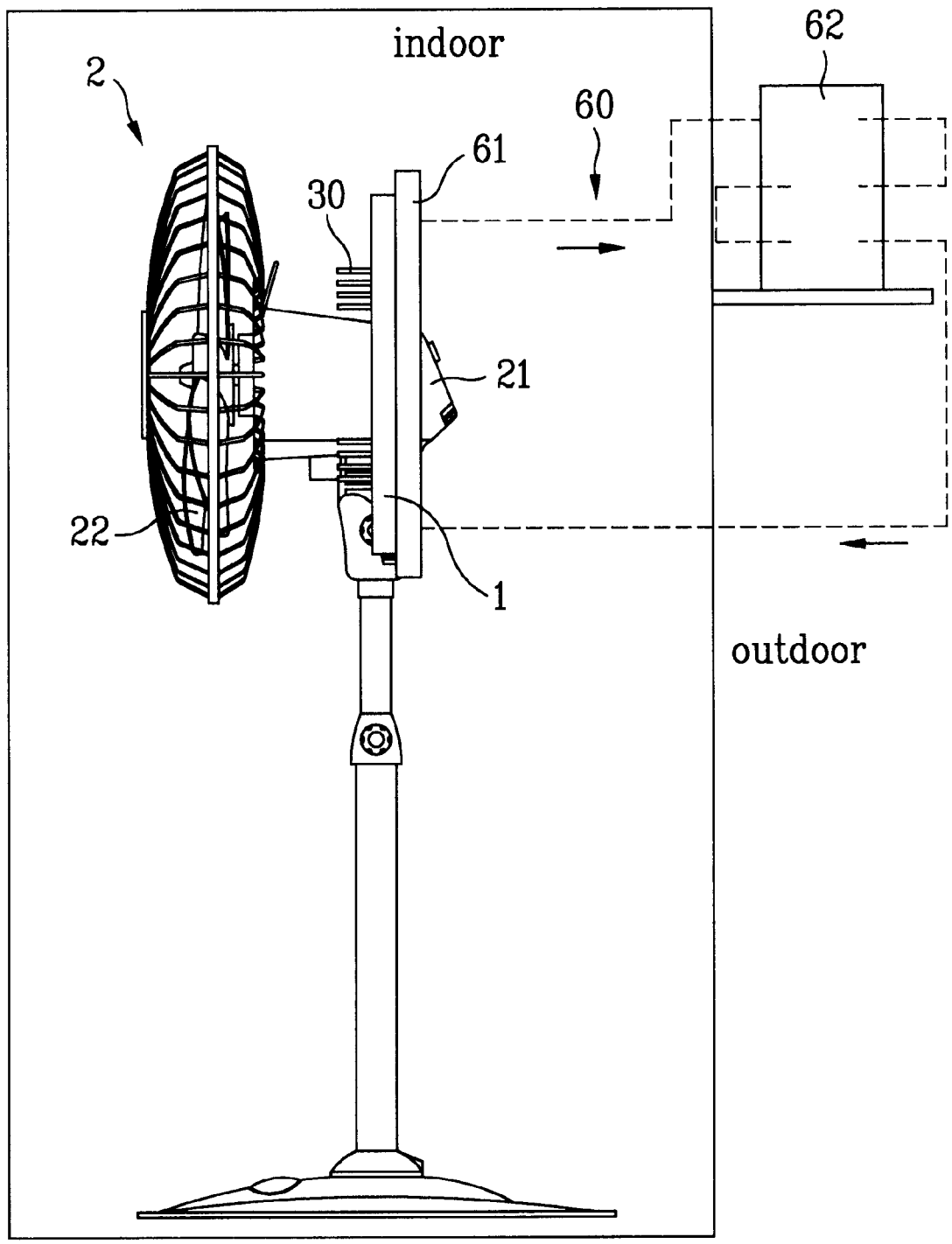
FIG. 7 illustrates a side view of a thermoelectric cooler in accordance with a third preferred embodiment of the present invention.

Referring to FIG. 7, the thermoelectric cooler 100 in accordance with a third preferred embodiment of the present invention includes a thermosiphon connected to a thermoelectric module 1 of the thermoelectric cooler 100 for rejection of heat dissipated at a heat dissipation side of the thermoelectric module 1 to outside of the thermoelectric cooler 100. The thermosiphon 60 includes an evaporator 61 disposed in a room, and a condenser 62 disposed outside of the room. The evaporator 61 has a working fluid filled inside of a body, and a refrigerant inlet tube 163 connected to one side of a lower part thereof, and a refrigerant outlet 164 connected to the other side of an upper part thereof. The condenser 62, one of general heat exchangers, fitted to outside of the room has fins 30 on outside of tube the working fluid flows therein for increasing a heat dissipation area, and tube connected to the evaporator 61. The condenser 62 is placed at a position higher than the evaporator 61.

Figure 8:
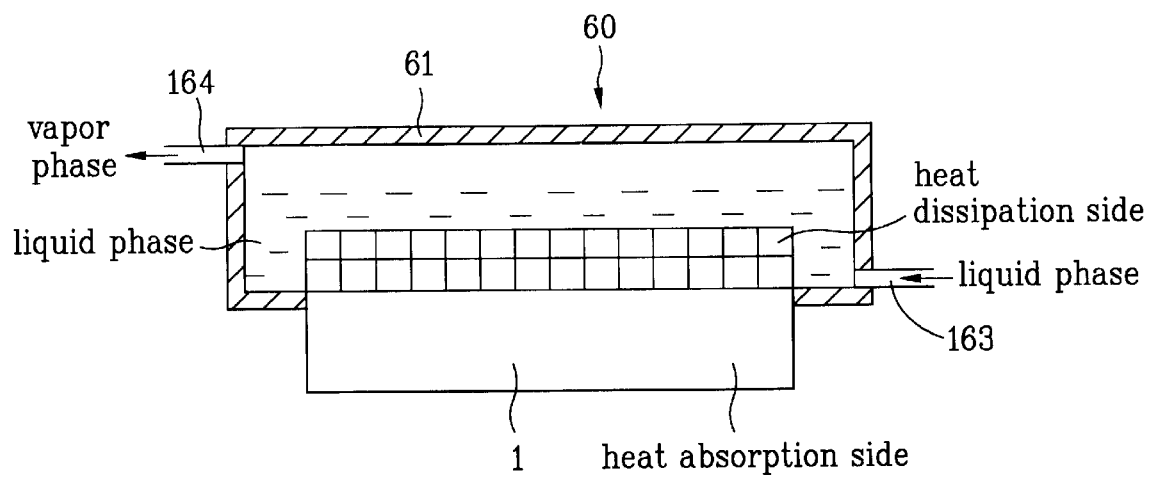
FIG. 8 illustrates a section of a thermosiphon evaporator in FIG. 7.
Figure 9:
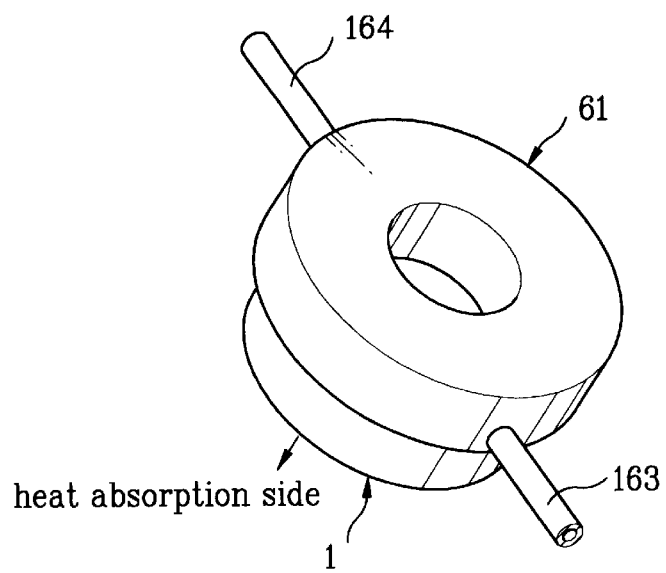
FIG. 9 illustrates a perspective view of the thermosiphon evaporator in FIG. 8.

Referring to FIG. 8, the evaporator 61 is designed to have a structure in which a heat dissipation side surface of the thermoelectric device is submerged in the working fluid for an efficient transfer of the heat from the heat dissipation side of the thermoelectric device to the cooling medium filled in the coolant flow passage.

Upon application of a current to the thermoelectric module 1 of the thermoelectric cooler 100 having the thermosiphon 60 fitted thereto, the heat is dissipated at the heat dissipation side, and absorbed by the working fluid in the evaporator 61 coupled to the thermosiphon 60. The working fluid absorbed the heat is vaporized, and flows toward the condenser 62 side through the refrigerant outlet 164. The working fluid introduced into the condenser 62 is condensed by heat exchange with external air as the working fluid flows inside of the condenser 62, and flows into the evaporator 61 again by gravity owing to a difference of heights between the condenser 62 and the evaporator 61. That is, the heat rejected from the heat dissipation side of the thermoelectric device is transferred to the refrigerant in the evaporator 61 the heat dissipation side is submerged therein, and rejected to the air at the condenser.

Thus, the thermoelectric cooler 100 in accordance with a third preferred embodiment of the present invention can cool down room air more effectively as the heat dissipated at the heat dissipation side of the thermoelectric module 1 can be rejected to the air effectively by the thermosiphon having a simple structure and operative on a temperature difference and gravity without driving part.

In the meantime, as has been explained, referring to FIGS. 7A–7C, the thermoelectric module 1 employed in the third embodiment thermoelectric cooler 100 of the present invention may also have a through hole of a circular or other forms at a center thereof in conformity with a part, such as the motor 21, the thermoelectric module 1 is to be fitted thereto, may be planar or cylindrical in an overall outer appearance, and, in addition to this, may be an arc form which has the smaller radius of curvature as it goes the nearer to a front side of the electrical fan, or a bent form which has a bent at a middle part, for smooth wind blow toward the motor shaft coupled to the fan blade set 22.

In the meantime, through each of the thermoelectric coolers of the present invention is designed such that the air cooled at the heat absorption side of the thermoelectric module 1 flows away from the heat absorption side of the thermoelectric module 1, if the heat pipe 50 or the thermosiphon is provided like the case of the second embodiment, or the third embodiment of the present invention, the thermoelectric cooler may be designed such that the air blown by the fan blades 22 is directed to the heat absorption side of the thermoelectric module 1, reflected at the heat absorption side of the thermoelectric module 1, and scattered into the room.

As has been explained, the thermoelectric cooler of the present invention has the following advantages.

The employment of a thermoelectric module in an electric fan in the present invention permits to add a cooling function to the electric fan as air cooled down by the thermoelectric module is blown to the user, and the thermoelectric cooler of the present invention is easy to fabricate, and install, and has a low cost, significantly low noise compared to any existing air conditioner which uses a compressor and the like, and a reduced power consumption.

When a small fan, a heat pipe, or a thermosiphon is employed in the thermoelectric cooler of the present invention, the cooling efficiency is enhanced because the heat dissipated at the heat dissipation side of the thermoelectric module can be rejected to the atmosphere, more effectively.

It will be apparent to those skilled in the art that various modifications and variations can be made in the thermoelectric cooler of the present invention without departing from the spirit or scope of the invention. Thus, it is intended that the present invention cover the modifications and variations of this invention provided they come within the scope of the appended claims and their equivalents.

What is claimed is:

1. A thermoelectric cooler for an unenclosed space comprising:
   a thermoelectric module having thermoelectric elements each for absorbing or dissipating heat at a junction of two different metals depending on a direction of a current flowing through the junction;
   a fan blade set for blowing air cooled at a heat absorption side of the thermoelectric module to a desired place in said unenclosed space;
   a motor for giving a rotating force to the fan blade set; and,
   a motor housing for enclosing said motor;
   said thermoelectric module being fitted to an outer circumference of said motor housing.

2. A thermoelectric cooler as claimed in claim 1, wherein the thermoelectric module is planar.

3. A thermoelectric cooler as claimed in claim 2, wherein the thermoelectric module is circular or rectangular.

4. A thermoelectric cooler as claimed in claim 2, wherein the thermoelectric module is planar in an arc form which has the smaller radius of curvature as it goes the nearer to a front side of the electrical fan, or a bent form which has a bent at a middle part, for smooth wind blow toward the motor shaft coupled to the fan blade set.

5. A thermoelectric cooler as claimed in claim 2, wherein the thermoelectric module has an area of the planar form at least greater than an area of the fan blade set.

6. A thermoelectric cooler as claimed in claim 1, wherein the thermoelectric module is detachably fitted to an outer circumference of the motor housing.

7. A thermoelectric cooler as claimed in claim 1, further comprising heat dissipation means fitted to surfaces of the heat absorption side or a heat dissipation side of the thermoelectric module.

8. A thermoelectric cooler as claimed in claim 7, wherein the heat dissipation means is fins for increasing a heat exchange surface at the surfaces of the heat absorption side or the heat dissipation side.

9. A thermoelectric cooler as claimed in claim 7, wherein the heat dissipation means is an additional fan fitted to the heat dissipation side of the thermoelectric cooler.

10. A thermoelectric cooler, comprising:
    a thermoelectric module having thermoelectric elements each for absorbing or dissipating heat at a junction of two different metals depending on a direction of a current flowing through the junction;
    a fan blade set for blowing air cooled at a heat absorption side of the thermoelectric module to a desired place;
    a motor for giving a rotating force to the fan blade set; and
    heat dissipation means fitted to surfaces of the thermoelectric module, wherein the heat dissipation means is a heat pipe fitted to the heat dissipation side of the thermoelectric cooler.

11. A thermoelectric cooler as claimed in claim 10, wherein the heat pipe is a duplex tube having both ends formed of a material of a high heat conductivity, and an inner tube and an outer tube for flow of a working fluid with different phases in different directions.

12. A thermoelectric cooler as claimed in claim 10, wherein a condensing part positioned on an outdoor side of the heat pipe has fins or grooves for increasing a heat dissipation rate.

13. A thermoelectric cooler as claimed in claim 7, wherein the heat dissipation means is a thermosiphon having an evaporator and a condenser.

14. A thermoelectric cooler as claimed in claim 13, wherein the thermosiphon includes an evaporator disposed in the room, a condenser disposed outside of the room, and tube for connecting the evaporator and the condenser, wherein the evaporator is fitted to the heat dissipation side of the thermoelectric module, and the condenser connected to the heat dissipation side by the tube is positioned higher than the evaporator.

15. A thermoelectric cooler comprising:
    a thermoelectric module having thermoelectric elements each for absorbing or dissipating a heat at a junction of two different metal depending on a direction of a current flowing through the junction;
    a heat pipe fitted to a heat dissipation side of the thermoelectric module;

a fan blade set for blowing air cooled at a heat absorption side of the thermoelectric module to a desired place; and, a motor for giving a rotating force to the fan blade set.

16. A thermoelectric cooler as claimed in claim 15, wherein the heat pipe is a duplex tube having both ends formed of a material of a high heat conductivity, and an inner tube and an outer tube for flow of a working fluid with different phases in different directions.

17. A thermoelectric cooler comprising:

a thermoelectric module having thermoelectric elements each for absorbing or dissipating a heat at a junction of two different metal depending on a direction of a current flowing through the junction;

a thermosiphon fitted to a heat dissipation side of the thermoelectric module;

a fan blade set for blowing air cooled at a heat absorption side of the thermoelectric module to a desired place; and, a motor for giving a rotating force to the fan blade set.

18. A thermoelectric cooler as claimed in claim 17, wherein the thermosiphon includes an evaporator disposed in the room, a condenser disposed outside of the room, and tube for connecting the evaporator and the condenser, wherein the evaporator is fitted to the heat dissipation side of the thermoelectric module, and the condenser connected to the heat dissipation side by the tube is positioned higher than the evaporator.

19. A thermoelectric cooler as claimed in claim 1, wherein the thermoelectric cooler is a free standing unit.

* * * * *